(12) United States Patent
Niijima

(10) Patent No.: US 7,100,099 B2
(45) Date of Patent: Aug. 29, 2006

(54) TEST APPARATUS

(75) Inventor: Hirokatsu Niijima, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/343,463

(22) Filed: Jan. 31, 2006

(65) Prior Publication Data

US 2006/0129335 A1 Jun. 15, 2006

Related U.S. Application Data

(63) Continuation of application No. PCT/JP2004/010318, filed on Jul. 20, 2004.

(30) Foreign Application Priority Data

Jul. 31, 2003 (JP) ............................. 2003-284470

(51) Int. Cl.
*G01B 5/28* (2006.01)
*G11B 5/00* (2006.01)
(52) U.S. Cl. ....................................... 714/744; 702/35
(58) Field of Classification Search .................. 702/35; 324/158.1
See application file for complete search history.

(56) References Cited

U.S. PATENT DOCUMENTS 6,479,983 B1 * 11/2002 Ebiya ...................... 324/158.1

2001/0052097 A1 12/2001 Miura ......................... 714/44

FOREIGN PATENT DOCUMENTS

JP 2001-201532 7/2001
WO WO-03/060533 A1 7/2003

OTHER PUBLICATIONS

International Search Report issued for PCT/JP2004/010318 mailed on Nov. 2, 2004, 1 page.
Patent Abstracts of Japan, Publication No.: 2001-201532, Publication Date: Jul. 27, 2001, 2 pages.

* cited by examiner

*Primary Examiner*—Michael Nghiem
*Assistant Examiner*—Victor J. Taylor
(74) *Attorney, Agent, or Firm*—Osha-Liang LLP

(57) ABSTRACT

The semiconductor testing apparatus includes a data sampler for acquiring a plurality of clock cross-over test data samples from the DUT using data change point detection from the sample data value and a data change point storage section writing the DCP based on CLK 1 and reading the DCP based on CLK 2 and a clock sampler acquiring a plurality of clock sample values from the DUT and a clock change point detection section detecting a clock change point from the sample value and a clock change point storage section writing the clock change point based on CLKS and reading CCP based on CLKZ using a phase difference detection section detecting the phase difference between the data change point and the clock change point which are simultaneously read from the storage section with comparison to the phase difference with the specifications data and outputting the passed or failed display indication.

15 Claims, 8 Drawing Sheets

TEST APPARATUS

CROSS REFERENCE TO RELATED APPLICATION

This is a continuation application of PCT/JP2004/010318 filed in PC on Jul. 20, 2004 which claims priority from a Japanese Patent Application No. JP 2003-284470 filed on Jul. 31, 2003, the contents of which are incorporated herein by reference.

BACKGROUND OF THE INVENTION

1. Field of the Invention

The present invention relates to a test apparatus, particularly a test apparatus for testing a device under test for synchronizing a data signal with a clock signal to output the same.

2. Related Art

Conventionally, there is a semiconductor memory for writing a data signal inputted together with a clock signal in synchronism with each other and outputting the data signal together with the clock signal in synchronism with each other to receive/transmit the data signal at the timing of the clock signal. Such semiconductor memory can not desirably operate unless the timing at which the clock signal is outputted and the timing at which the data signal is outputted are preciously synchronized. Therefore, when such semiconductor memory is tested, it has been determined that the semiconductor memory is passed or failed by detecting the change point of the clock signal and the change point of the data signal, which are outputted from the semiconductor memory being a device under test using a multi-strobe signal to detect the phase difference between the clock signal and the data signal and comparing the phase difference with the spec, as disclosed in Japanese Application Publication No. 2001-201532 and No. 2001-356153.

The semiconductor memory such as a synchronous device outputs a plurality of data signals in synchronism with the clock signal. Therefore, it is necessary that data indicative of the change point of the clock signal is separately provided to phase difference detection means which are installed corresponding to the plurality of data signals in order to detect the phase difference between each of the data signals and the clock signal in parallel. However, it takes time to provide data of the change point of the clock signal to the plurality of phase difference detection means because transmission delay times are occurred in a distribution circuit for distributing data indicative of the change point of the clock signal and a transmission path for transmitting data indicative of the change point of the clock signal to the phase difference detection means. Therefore, the phase difference between the clock signal and the data signal sometimes can not be detected in real time and in synchronism with outputting by the device under test.

SUMMARY OF THE INVENTION

Thus, it is an object of the present invention to provide a test apparatus which is capable of solving the problem accompanying the conventional art. The above object and other objects can be achieved by combining the features recited in independent claims. Then, dependent claims define further effective specific examples of the present invention.

To solve the above-described problem, a first aspect of the present invention provides a test apparatus for testing a device under test synchronizing a data signal with a clock signal to output the same. The test apparatus includes: a data sampler for continuously sampling data signals outputted from the device under test to acquire a plurality of data sample values; a data change point detection section for detecting a data change point at which the data signal is changed based on the plurality of data sample values acquired by the data sampler; a data change point storage section for writing the data change point detected by the data change point detection section based on a first clock signal and reading the same based on a second clock signal of which period is approximately same as the first clock signal and of which phase is different from the first clock signal; a clock sampler for continuously sampling clock signals outputted from the device under test to acquire a plurality of clock sample values; a clock change point detection section for detecting a clock change point being the point at which the clock signal is changed; a clock change point storage section for writing the clock change point detected by the clock change point detection section based on a third clock signal and reading the same based on the second clock signal; a phase difference detection section for comparing the data change point with the clock change point which are simultaneously read from the data change point storage section and the clock change point storage section based on the second clock signal to detect the phase difference between the data signal and the clock signal by; and a spec comparison section for comparing the phase difference detected by the phase difference detection section with a predetermined spec to determine that the device under test is passed or failed.

The phase difference between the first clock signal and the second clock signal may be more than the difference between the transmission delay time from the data change point detection section to the point of data storage section and the transmission delay time from the clock change point detection section to the clock change point storage section.

The test apparatus may further includes a data signal processing unit in which the data sampler, the data change point detection section, the data change point storage section, the clock change point storage section, the phase difference detection section and the spec comparison section are formed, a clock signal processing unit in which the clock sampler and the clock change point detection section are formed, a transmission path through which the data signal processing unit and the clock signal processing unit are electrically connected, for providing the clock change point detected by the clock change point detection section to the clock change point storage section. The phase difference between the first clock signal and the second clock signal may be more than the transmission delay time in the transmission path.

The test apparatus may includes a plurality of data signal processing units. The transmission path may electrically connect the clock signal processing unit and the plurality of data signal processing unit and provide the clock change point detected by the clock change point detection section included in the clock signal processing unit to a plurality of clock change point storage sections for each of the plurality of data signal processing units. The plurality of clock change point storage sections may write the clock change point detected by the clock change point detection section based on the third clock signal and read the same based on the second clock signal.

A second aspect of the present invention provides a test apparatus for testing a device under test synchronizing a data signal with a clock signal to output the same. The test apparatus includes: a data change point detection section for detecting a data change point at which the data signal outputted from the device under test is changed; a clock change point detection section for detecting a clock change point at which the clock signal outputted from the device under test is changed; and a phase difference detection section for comparing the data change point with the clock change point every time the device under test outputs a data signal and a clock signal to detect the phase difference between the data signal and the clock signal, and, for comparing the phase difference with a predetermined allowed value to determine that the device under test is passed or failed.

The phase difference detection section includes: an arithmetic circuit for subtracting the data change point from the clock change point or subtracting the clock change point from the data change point to output the phase difference; a maximum allowed value comparison section for comparing the phase difference detected by the arithmetic circuit with a predetermined maximum allowed value, outputting the logical value 0 when the phase difference is less than the maximum allowed value and outputting the logical value 1 when the phase difference is more than the maximum allowed value; a minimum allowed value comparison section for comparing the phase difference detected by the arithmetic circuit with a predetermined minimum allowed value, outputting the logical value 0 when the phase difference is more than the minimum allowed value and outputting the logical value 1 when the phase difference is less than the minimum allowed value and an OR circuit for performing OR operation of the logical value outputted by the maximum allowed value comparison section and the logical value outputted by the minimum allowed value comparison section.

A third aspect of the present invention provides a test apparatus for testing a device under test. The test apparatus includes: a change point detection section for detecting a data change point at which the data signal outputted from the device under test is changed and outputting data of a plurality of bits indicative of the detected data change point; a start determination signal output section for outputting a start determination signal to output the logical value 0 when the data signal is more than a H side threshold value (VOH) at a time at which the data signal outputted from the device under test is started to output and output the logical value 1 when the data signal is less than H side threshold value; and a loose function section having a first OR circuit for performing an OR operation of data of the plurality of bits outputted by the change point detection section and an AND circuit for performing an AND operation of the inverted output of the OR circuit and the output of the start determination signal output section, for detecting that there is no data change point in the data signal and the data signal is less than the H side threshold value and outputting the same.

A fourth aspect of the present invention provides a test apparatus for testing a device under test. The test apparatus includes: a change point detection section for detecting a data change point at which the data signal outputted from the device under test is changed and outputting data of a plurality of bits indicative of the detected data change point; a start determination signal output section for outputting a start determination signal to output the logical value 0 when the data signal is less than a L side threshold value (VOL) at a time at which the data signal outputted from the device under test is started to output and output the logical value 1 when the data signal is more than L side threshold value; and a loose function section having a first OR circuit for performing an OR operation of data of the plurality of bits outputted by the change point detection section and an AND circuit for performing an AND operation of the inverted output of the OR circuit and the output of the start determination signal output section, for detecting that there is no data change point in the data signal and the data signal is less than the L side threshold value and outputting the same.

The test apparatus further includes a glitch detection section for detecting whether any glitch is generated in the data signal, outputting the logical value 1 when a glitch is detected and outputting the logical value 0 when any glitch is not detected. The loose function section may further include a second OR circuit for performing an OR operation of the output of the AND circuit and the output of the glitch detection section and further detect that a glitch is generated in the data signal.

A fifth aspect of the present invention provides a test apparatus for testing a device under test. The test apparatus includes: a change point detection section for detecting a data change point at which the data signal outputted from the device under test is changed and outputting data of a plurality of bits indicative of the detected data change point; a start determination signal output section for outputting a start determination signal to output the logical value 0 when the data signal is more than a H side threshold value at a time at which the device under test starts to output the data signal and output the logical value 1 when the data signal is less than H side threshold value; and a loose function section having a first OR circuit for performing an OR operation of the plurality of bits of data outputted by the change point detection section and an AND circuit for performing an AND operation of the inverted output of the OR circuit and the output of the start determination signal output section, for detecting that data signal is changed from the value less than the H side threshold value to the value more than the H side threshold value and outputting the same.

A sixth aspect of the present invention provides a test apparatus for testing a device under test. The test apparatus includes: a change point detection section for detecting a data change point at which the data signal outputted from the device under test is changed and outputting data of a plurality of bits indicative of the detected data change point; a start determination signal output section for outputting a start determination signal to output the logical value 0 when the data signal is less than a L side threshold value at a time at which the device under test starts to output the data signal and output the logical value 1 when the data signal is more than L side threshold value; and a loose function section having a first OR circuit for performing an OR operation of the plurality of bits of data outputted by the change point detection section and an AND circuit for performing an AND operation of the inverted output of the OR circuit and the output of the start determination signal output section, for detecting that data signal changed from the value more than the L side threshold value to the value less than the L side threshold value and outputting the same.

The test apparatus may further include a glitch detection section for detecting that a glitch is generated in the data signal based on the plurality of bits of data outputted by the change point detection section, outputting the logical value 1 when a glitch is detected and outputting the logical value 0 when any glitch is not detected. The loose function section may further include a second OR circuit for performing an OR operation of the output of the AND circuit and the output of the glitch detection section and further detect that a glitch is generated in the data signal.

A seventh aspect of the present invention provides a test apparatus for testing a device under test. The test apparatus includes: a H side level comparison section for sequentially determining whether the data signal outputted from the device under test is more than a H side threshold value and outputting the same; a H side data change point detection section for detecting a data change point at which the data signal outputted by the H side level comparison section is changed; a L side level comparison section for sequentially determining whether the data signal outputted from the device under test is less than a H side threshold value (VOL) and outputting the same; an L side data change point detection section for detecting a data change point at which the data signal outputted by the L side level comparison section is changed; and a phase difference detection section for comparing the H side data change point with the L side data change point to detect the leading edge time or the trailing edge time of the data signal every time the device under test outputs the data signal and comparing the leading edge time or the trailing edge time with a predetermined allowed value to determine that the device under test is passed or failed.

The phase difference detection section includes: an arithmetic circuit for subtracting the H side data change point from the H side data change point or subtracting the L side data change point from the H side data change point and outputting the leading edge time or the trailing edge time; a maximum allowed value comparison section for comparing the leading edge time or the trailing edge time outputted by the arithmetic circuit with a predetermined maximum allowed value, outputting the logical value 0 when the leading edge time or the trailing edge time is less than the maximum allowed value and outputting the logical value 1 when the leading edge time or the trailing edge time is more than the maximum allowed value; a minimum allowed value comparison section for comparing the leading edge time or the trailing edge time outputted by the arithmetic circuit with a predetermined minimum allowed value, outputting the logical value 0 when the leading edge time or the trailing edge time is more than the minimum allowed value and outputting the logical value 1 when the leading edge time or the trailing edge time is less than the minimum allowed value; and an OR circuit for performing an OR operation of the logical value outputted by the maximum allowed value comparison section and the logical value outputted by the minimum allowed value comparison section.

An eighth aspect of the present invention provides a test apparatus for testing a device under test. The test apparatus includes: an H side level comparison section for sequentially determining whether the data signal outputted from the device under test is more than an H side threshold value and outputting the same; an H side data change point detection section for detecting an H side data change point at which the data signal outputted by the H side level comparison section is changed; an L side level comparison section for sequentially determining whether the data signal outputted from the device under test is less than an L side threshold value and outputting the same; an L side data change point detection section for detecting a data change point at which the data signal outputted by the L side level comparison section is changed; and an output timing phase detection section for detecting a timing at which it starts to change the data signal, which is the middle point between the H side data change point and the L side data change point every time the device under test outputs the data signal, and for comparing the timing at which it starts to change the data signal with a predetermined allowed value to determine that the device under test is passed or failed.

The output timing phase detection section includes: an arithmetic circuit for calculating the timing at which it starts to change the data signal based on the H side data change point and the L side data change point; a maximum allowed value comparison section for comparing the timing at which it starts to change the data signal, which is outputted by the arithmetic circuit with a predetermined maximum allowed value, outputting the logical value 0 when the timing at which it starts to change the data signal is less than the maximum allowed value and outputting the logical value 1 when the timing at which it starts to change the data signal is more than the maximum allowed value; a minimum allowed value comparison section for comparing the timing at which it starts to change the data signal outputted by the arithmetic circuit with a predetermined minimum allowed value, outputting the logical value 0 when the timing at which it starts to change the data signal is more than the minimum allowed value and outputting the logical value 1 when the timing at which it starts to change the data signal is less than the minimum allowed value; and an OR circuit for performing an OR operation of the logical value outputted by the maximum allowed value comparison section and the logical value outputted by the minimum allowed value comparison section.

Here, all necessary features of the present invention are not listed in the summary of the invention. The sub-combinations of the features may become the invention.

According to the present invention, a test apparatus for accurately testing in real time a device under test for synchronizing a data signal with a clock signal and outputting the same.

DETAILED DESCRIPTION OF THE INVENTION

Hereinafter, the present invention will now be described through referred embodiments. The embodiments do not limit the invention according to claims and all combinations of the features described in the embodiments are not necessarily essential to means for solving the problems of the invention.

Figure 1:
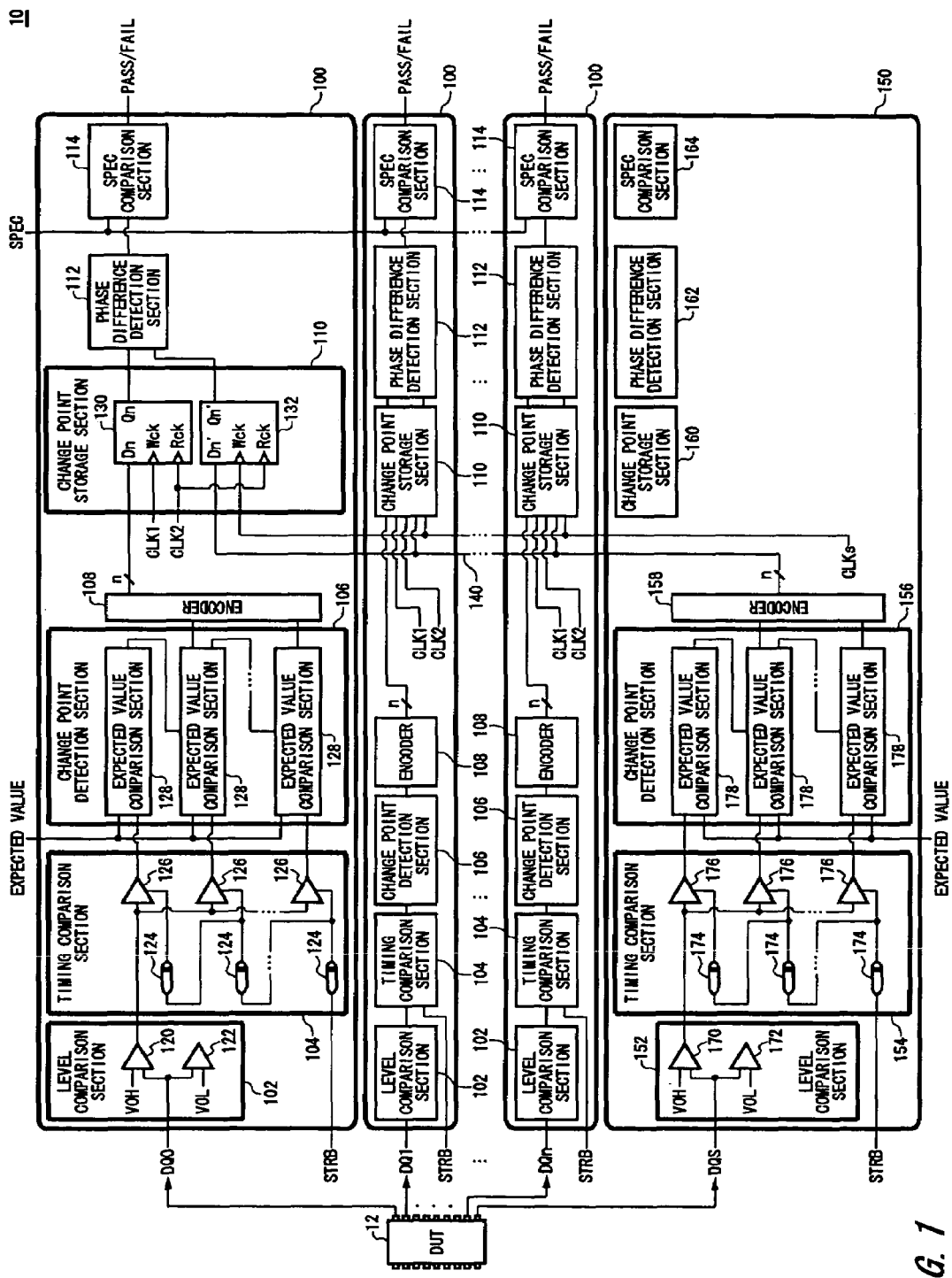
FIG. 1 shows an example of the configuration of a test apparatus 10.

FIG. 1 shows an example of the configuration of a test apparatus 10 according to a first embodiment of the present invention. The test apparatus 10 aims to accurately test in real time a device under test (DUT) 12 such as a synchronous device for synchronizing data signals (DQ0–DQn) and a clock signal (DQS) and outputting the same. Specifically, the test apparatus 10 detects the phase difference between each of the DQ0–DQn and the DQS outputted by the DUT 12 in parallel and real time, and compares the detected phase difference with the spec to determine that the DUT 12 is passed or failed.

The test apparatus 10 includes a plurality of data processing units 100 for processing DQ0–DQn outputted by the DUT 12, respectively, a clock signal processing unit 150 for processing a DQS outputted by the DUT 12 and a transmission path 140 for electrically connecting the data signal processing unit 100 and the clock signal processing unit 150. The plurality of data signal processing units 100 and the clock signal processing unit 150 are such as ASICs (Application Specific Integrated Circuit) and are configured as the individual integrated circuits.

In the data signal processing unit 100, a level comparison section 102, a timing comparison section 104, a change point detection section 106, an encoder 108, a change point storage section 110, a phase difference detection section 112 and a spec comparison section 114 are formed. Meanwhile, in the clock signal processing unit 150, a level comparison section 152, a timing comparison section 154, a change point detection section 156, an encoder 158, a change point storage section 160, a phase difference detection section 162 and a spec comparison section 164. The data signal processing units 100 and the clock signal processing unit 150 are configured as the similar integrated circuit and have the similar configuration. Here, the change point storage section 160, the phase difference detection section 162 and the spec comparison section 164 included in the clock signal processing unit 150 may not operate in order to detect the phase difference between each of the DQ0–DQn and the DQS.

The level comparison section 102 includes a level comparator 120 for comparing the DQ outputted by the DUT 12 with a H side threshold value (VOH), determining whether the voltage value of the H logic of the DQ is more than the VOH and outputting the result and a level comparator 122 for comparing the voltage value of the DQ outputted by the DUT 12 with a L side threshold voltage (VOL), determining whether the voltage value of the L logic of the DQ is more than the VOL and outputting the result The level comparison section 152 includes a level comparator 170 for comparing the voltage value of the DQS outputted by the DUT 12 with a H side threshold value (VOH), determining whether the voltage value of the H logic of the DQS is more than the VOH and outputting the result and a level comparator 172 for comparing the DQS outputted by the DUT 12 with a L side threshold voltage (VOL), determining whether the voltage value of the L logic of the DQS is more than the VOL and outputting the result.

Each of the timing comparison sections 104 is an example of the data sampler of the present invention. The timing comparison section 104 sequentially samples the DQs outputted from the DUT 12, acquires a plurality of sample values and outputs the same. Specifically, each of the timing comparison sections 104 includes a plurality of delay circuits 124 and a plurality of timing comparators 126. The plurality of delay circuits 124 add the phase difference to a strobe signals (STRB) little by little and provides the plurality of strobe signals each of which phase is different from each other little by little to each of the timing comparators 126. The plurality of timing comparators 126 read the output of the level comparator 120 or the level comparator 122 based on the STRBs provided from each of the plurality of delay circuits 124 and output a plurality of data sample values.

The timing comparison section 154 is an example of the clock sampler of the present invention. The timing comparison section 154 sequentially samples the DQS outputted from the DUT 12, acquires a plurality of clock sample values and outputs the same. Specifically, the timing comparison section 154 includes a plurality of delay circuits 174 and a plurality of timing comparators 176 and operates as well as the timing comparison sections 104 to process the DQS.

The change point detection sections 106 and the encoders 108 are examples of the data change point detection section of the present invention. The change point detection sections 106 and the encoders 108 detect the data change point at which the DQ is changed based on the plurality of data sample values acquired by the timing comparison sections 104. Specifically, each of the change point detection sections 106 includes a plurality of expected value sections 128. The plurality of expected value comparison sections 128 compare the data sample vale outputted by each of the plurality of timing comparators 126 with a predetermined expected value and provide the comparison result to the subsequent expected value comparison section 128. Then, the plurality of expected value comparison section 128 determine whether the comparison result provided from the anterior expected value comparison section 128 corresponds to the comparison result in itself and output the determination. Then, the encoders 108 detect the point at which the DQ is changed based on the correspondence between the determinations outputted from the plurality of expected value comparison sections 128 and the phases of the STRBs provided to the plurality of timing comparators 126, respectively and output data of a plurality of bits indicative of the detected point at which the data is changed.

The change point detection section 156 and the encoder 158 are examples of the clock change point detection section of the present invention. The change point detection section 156 and the encoder 158 detect the clock change point at which the DQS is changed based on the plurality of clock sample values acquired by the timing comparison section 154. Specifically, the change point detection section 156 includes a plurality of expected value comparison sections 178 and operates as well as the change point detection sections 106 to process the DQS.

The transmission path 140 electrically connects in series the clock signal processing unit 150 and the plurality of data signal processing units 100 along thereof. Then, the transmission path 140 provides a clock change point detected by the change point detection section 156 and the encoder 158 included in the clock signal processing unit 150 to a plurality of clock change point storage sections 132 for each of the plurality of data signal processing units 100, respectively. That is to say, the transmission path 140 inputs the clock change point outputted from the terminal of the clock signal processing unit 150 to the data signal processing unit 100 adjacent to the clock signal processing unit 150 and further inputs the clock change point inputted to the data signal processing unit 100 and outputted from the data signal processing unit 100 to the data signal processing unit 100 adjacent to the former data signal processing unit 100. Thus, the clock change point is provided to all of the plurality of data signal processing units 100 for detecting the phase difference between the DQS and the DQ through the transmission path 140 for connecting the plurality of data signal processing units 100 in series.

Each of the change point storage section 110 has a data change point storage section 130 for holding the data change point detected by the change point detection section 106 and the encoder 108 and a clock change point storage section 132 for holding the clock change point detected by the change point detection section 156 and the encoder 158. The data change point storage section 130 and the clock change point storage section 132 are such as MRAMs (Multi-port Random Access Memory). The data change point storage section 130 writes the data change point detected by the change point detection section 106 and the encoder 108 based on a clock signal (CLK1) and reads the same based on a clock signal (CLK2). The clock change point storage section 132 writes the clock change point detected by the change point detection section 156 and the encoder 158 based on a clock signal (CLKs) and read the same based on the clock signal (CLK2). That is to say, the data change storage section 130 and the clock change point storage section 132 write each of the data change point and the clock data point based on the different clock signals (CLK1 and CLKs), synchronizes with the same clock signal (CLK2) and reads the same.

The clock signal (CLK1) and the clock signal (CLK2) of which periods are approximately same and phases are different each other. The phase difference between the clock signal (CLK1) and the clock signal (CLK2) is more than the difference between the transmission delay time from the encoder 108 to the data change point storage section 130 and the transmission delay time from the encoder 158 to the clock change point storage section 132. Additionally, the phase difference between the clock signal (CLK1) and the clock signal (CLK2) is more than the transmission delay time in the transmission path between the clock signal processing unit 150 and the data signal processing unit 100 which is disposed most far from the clock signal processing unit 150 among the data signal processing units 100.

The phase difference detection section 112 compare the data change point with the clock change point which are simultaneously read from the data change point storage section 130 and the clock change point storage section 132 based on the clock signal (CLK2). Then, the phase difference detection section 112 detects the phase difference between the data change point and the clock change point and outputs the same. The spec comparison section 114 compares the phase difference detected by the phase difference detection section 112 with a predetermined spec to determine whether the DUT 12 is passed or failed and outputs information indicative of PASS or FAIL.

The test apparatus 10 according to the present embodiment provides the clock change point of the DQS detected by the clock signal processing unit 150 to the data processing units 100 through the transmission path 140 to which a plurality of data processing units 100 are connected in series. Therefore, the number of signals to be provided and the numbers of terminals can be reduced in the clock signal processing unit 150. Additionally, since the clock signals (CLK1, CLK2 and CLKs) for controlling the data change point storage section 130, and the clock change point storage section 132 to write and read have the above-described phase difference, the phase difference between the DQS and the DQ can be sequentially detected in synchronism with outputting the DQS and DQ by the DUT 12 even if the transmission delay time of the data change point is different from that of the clock change point. Therefore, the time required for determining that the DUT 12 is passed or failed can be reduced.

Figure 2A:
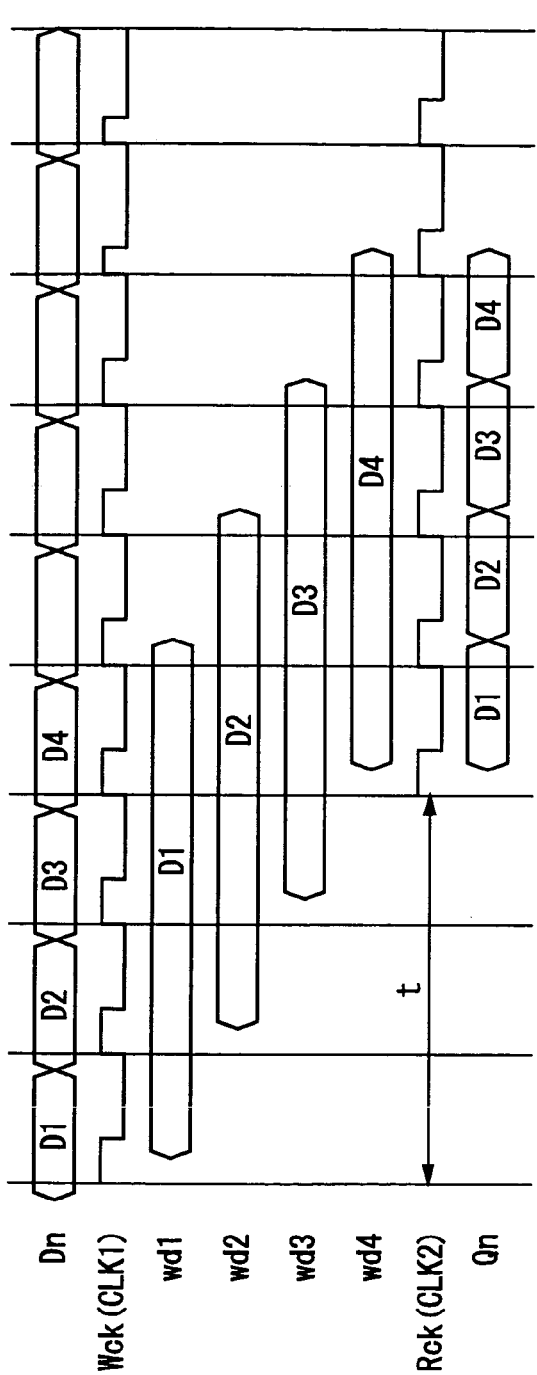
FIG. 2 shows an example of the writing/reading operation of a change point storage section 110.
Figure 2B:
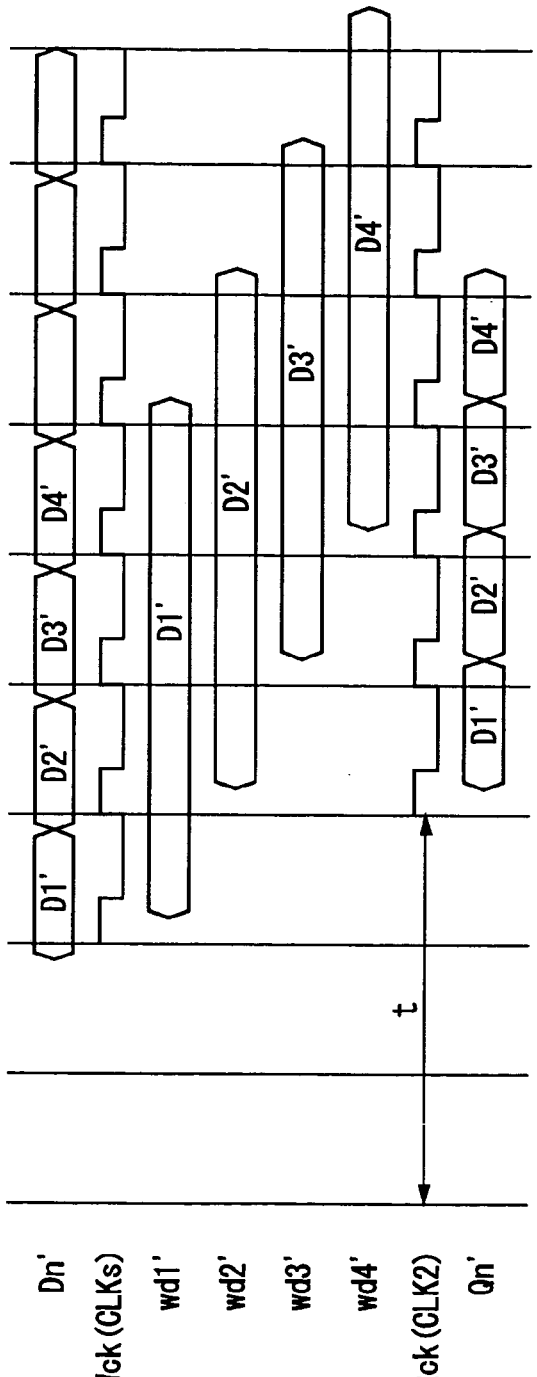

FIG. 2 shows an example of the writing/reading operation of a change point storage section 110. FIG. 2A shows an example of the writing/reading operation of a change point storage section 130. FIG. 2B shows an example of the writing/reading operation of a change point storage section 130.

As shown in FIG. 2A, the data change point storage sections 130 sequentially writes data Dn (D1, D2, D3, and D4 . . . ) which are sequentially detected by the change point detection section 106 and the encoder 108 to the different addresses based on the clock signal (CLK1) as a write clock. As shown in FIG. 2B, the clock change point storage section 132 sequentially writes data Dn' (D1', D2' D3' and D4', . . . ) for the clock change points which are sequentially detected by the change point detection section 156 and the encoder 158 to the different addresses based on the clock signal (CLKs) as a write clock. Then, as shown in FIGS. 2A and 2B, the data change point storage section 130 and the clock change point storage section 132 synchronize the data Dn (D1, D2, D3 and D4 . . . ) for data change points which are stored in the data change point storage section 130 and the data Dn' (D1', D2', D3' and D4' . . . ) for clock change points which are stored in the clock change point storage section 130 based on the clock signal (CLK2) as a read clock, respectively, and sequentially read the same.

Thus, write/read operations of the data change point storage section 130 and the clock change storage section 132 are controlled by using the above-described clock signals (CLK1, CLK2 and CLKs). Therefore, the phase difference between the DQS and the DQ can be sequentially detected in real time in synchronism with outputting the DQS and the DQ by the DUT 12.

Figure 3:
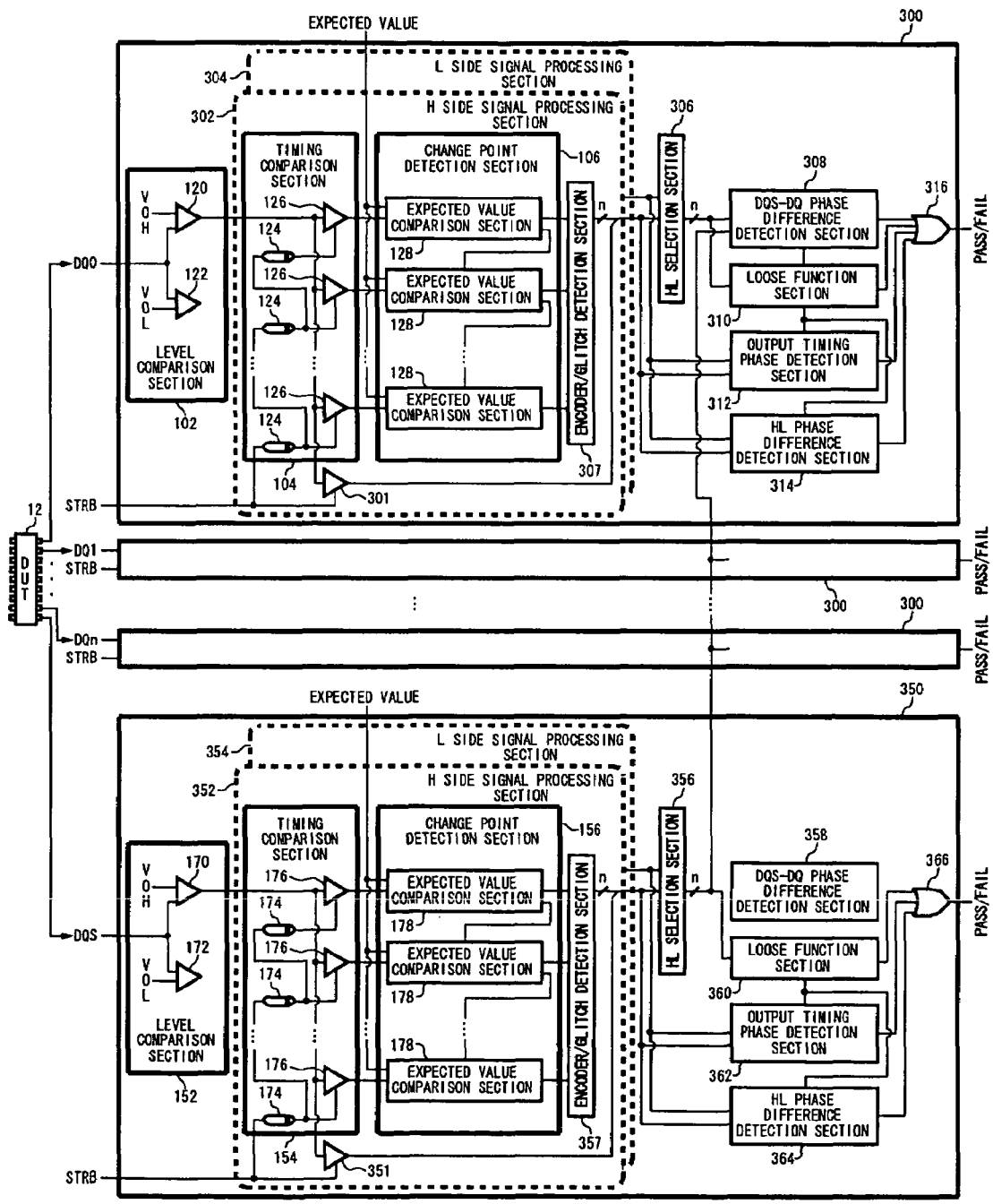
FIG. 3 shows an example of the configuration of a test apparatus 30.

FIG. 3 shows an example of the configuration of a test apparatus 30 according to a second embodiment of the present invention. The test apparatus 30 aims to accurately test in real time the DUT 12 such as a synchronous device for synchronizing data signals (DQ0–DQn) with the clock signal (DQS) and outputting the same. Specifically, the test apparatus 30 detects the phase difference between each of the DQ0–DQn and the DQS which are outputted by the DUT 12, the timing at which each of the DQ0–DQn and the DQS are outputted, the leading edge time and the trailing edge time are detected in parallel and real time and compare the same with the spec to determine that the DUT 12 is passed or failed. Here, the test apparatus 30 according to the present embodiment is same as the test apparatus 10 according to the first embodiment except for the following description and operates as well as the test apparatus 10.

The test apparatus 30 includes a plurality of data signal processing units 300 for processing DQ0–DQn which are outputted by the DUT 12, respectively and a clock signal processing unit 350 for processing the DQS outputted by the DUT 12. Each of the data signal processing unit 300 has a level comparison section 102, an H side signal processing unit 302, an L side signal processing unit 304, an HL selection section 306, a DQS-DQ phase difference detection section 308, a loose function section 310, an output timing phase detection section 312, an HL phase difference detection section 314 and an OR circuit 316. The clock signal processing unit 350 has a level comparison section 152, an H side signal processing unit 352, an L side signal processing unit 354, an HL selection section 356, a DQS-DQ phase difference detection section 358, a loose function section 360, an output timing phase detection section 362, an HL phase difference detection section 364 and an OR circuit 366. The data signal processing unit 300 and the clock signal processing unit 350 are configured with the similar integrated circuit and have the similar configuration. The DQS- DQ phase difference detection section 358 may not operate in order to detect the phase difference between each of the DQ0–DQn and the DQS.

Each of the level comparison sections 102 includes level comparator 120 which is an example of the H side level comparison section of the present invention and a level comparator 122 which is an example of the L side level comparison section of the present invention. The level comparator 120 sequentially determines whether the voltage value of the DQ outputted from the DUT 12 is more than VOH and outputs the result to the H side signal processing section 302. The level comparator 122 sequentially determines whether the voltage value of the DQ outputted from the DUT 12 is less than VOL and outputs the result to the L side signal processing section 304.

Each of the H side signal processing sections 302 includes a timing comparison section 104, a change point detection section 106, a timing comparator 301 and an encoder/glitch detection section 307. The H side signal processing section 302 is an example of the H side data change point detection section of the present invention. The H side signal processing section 302 processes the output of the level comparator 120 and detects the data change point of the DQ. Here, the change point detection section of the present invention may conceptually include the change point detection section 106 and the encoder/glitch detection section 307. Additionally, the timing comparison section 104 and the change point detection section 106 operate as well as the timing comparison section 104 and the change point detection section 106 shown in FIG. 1, so that the description is omitted. The timing comparator 301 is an example of the start determination signal output section of the present invention, which reads the output of the level comparator 120 based on a STRB and outputs a start determination signal indicating whether the voltage value of the DQ is more than VOH at the time at which it starts to output the DQ. Specifically, the timing comparator 301 outputs the logical value 0(PASS) when the voltage value of the DQ is more than VOH at the time at which the DUT 12 starts to output the DQ. Alternatively, the timing comparator 301 outputs the logical value 1 (FAIL) when the voltage value of the DQ is less than VOH at the time at which the DUT 12 starts to output the DQ.

In addition to the function same as the encoder 108 shown in FIG. 1, the encoder/glitch detection section 307 detects whether there are data change points of the DQ more than twice in one test cycle based on the determination result outputted by the plurality of expected value comparison sections 128, and outputs a glitch detection signal indicating whether there are the data change points more than twice, that is, whether a glitch is generated. Specifically, the encoder/glitch detection section 307 outputs the logical value 1 (FAIL) when a glitch is detected in the DQ. Alternatively, the encoder/glitch detection section 307 outputs the logical value 0 (PASS) when any glitch is not detected in the DQ. Here, the L side signal processing section 304 is an example of the L side data change point detection section of the present invention, which processes the output of the level comparator 122 and detects the data change point of DQ. The L side signal processing section 304 has the configuration same as the H side signal processing section 302 and operates as well as the L side signal processing section 304.

The level comparison section 152 includes a level comparator 170 and a level comparator 172. The level comparator 170 sequentially determines whether the voltage value of the DQS outputted from the DUT 12 is more than VOH and outputs the result to the H side signal processing section 352.

The level comparator 172 sequentially determines whether the voltage value of the DQS outputted from the DUT 12 is less than VOL and outputs the result to the L side signal processing section 354.

The H side signal processing section 352 includes a timing comparison section 154, a change point detection section 156, a timing comparator 351 and an encoder/glitch detection section 357. The H side signal processing section 352 is an example of the H side data change point detection section of the present invention, which processes the output of the level comparator 170 and detects the data change point of the DQS. The timing comparison section 154 and the change point detection section 156 operate as well as the timing comparison section 154 and the change point detection section 156 shown in FIG. 1, so that the description is omitted. The timing comparator 351 reads the output of the level comparator 170 based on the STRB and outputs a start determination signal indicating whether the voltage value of the DQS is more than VOH at the time at which it starts to output the DQS. Specifically, the timing comparator 351 outputs the logical value 0 (PASS) when the voltage value of the DQS is more than VOH at the time at which the DUT 12 starts to output the DQS. Alternatively, the timing comparator 351 outputs the logical value 1 (FAIL) when the voltage value of the DQS is less than VOH at the time at which the DUT 12 starts to output the DQS.

In addition to the function same as the encoder 158 shown in FIG. 1, the encoder/glitch detection section 357 detects whether there are data change points of the DQS more than twice in one test cycle based on the determination outputted from the plurality of expected value comparison section 178 and outputs the result. Here, the L side signal processing section 354 is an example of the L side data change point detection section of the present invention, which processes the output of the level comparator 172 and detects the data change point of the DQS. The L side signal processing section 354 has the configuration same as the H side signal processing section 352 and operates as well as the H side signal processing section 352.

Each of the HL selection section 306 selectively switches the output of the H side signal processing section 302 and the output of the L side signal processing section 304 and provides either one to the DQS-DQ phase difference detection section 308 and the loose function section 310. The HL selection section 356 selectively switches the output of the H side signal processing section 352 and the output of the L side signal processing section 354 and provides either one to the DQS-DQ phase difference detection section 358 and the loose function section 360.

Each of the DQS-DQ phase difference detection section 308 compares the data change point acquired from the HL selection section 306 and the clock change point acquired from the HL selection section 356 every time the DUT 12 outputs the DQS and the DQ to detect the phase difference between the DQG and the DQ. Then, the DQS-DQ phase difference detection section 308 compares the detected phase difference with a predetermined allowed value to determine that the DUT 12 is passed or failed and provides information indicative of PASS or FAIL to the OR circuit 316.

Each of the loose function section 310 acquires the data change point and the glitch detection signal detected by the encoder/glitch detection section 307 and the start determination signal outputted by the timing comparator 301 from the HL selection section 306. Then, the loose function section 310 detects whether any glitch is generated in the DQ, whether the DQ is consistently inverted to the expected value and whether the DQ is inverted to the expected value and changed to determine that the DUT 12 is passed or failed, and provides information indicative of PASS or FAIL to the OR circuit 316. Additionally, the loose function section 360 operates as well as the loose function section 310 and determines that the DUT 12 is passed or failed based on the DQS.

The output timing phase detection section 312 acquires an H side data change point which is the data change point detected by the H side signal processing section 302 and an L side data change point which is the data change point detected by the L side signal processing section 304 from each of the H side signal processing section 302 and the L side signal processing section 304. Then, the output timing phase detection section 312 detects a timing at which it starts to change the DQ, which is the middle point between the H side data change point and the L side data change point every time the DUT 12 outputs the DQ. Then, the output timing phase detection section 312 compares the detected timing at which it starts to change the DQ with a predetermined allowed value to determine that the DUT 12 is passed or failed, and provides information indicative of PASS or FAIL to the OR circuit 316. Additionally, the output timing phase detection section 362 operates as well as the output timing phase detection section 312 and determines that the DUT 12 is passed or failed base on the DQS.

Each of the HL phase difference detection section 314 acquires the H side data change point detected by the H side signal processing section 302 and the L side data change point detected by the L side signal processing section 304 from each of the H side signal processing section 302 and the L side signal processing section 304. Then, the HL phase difference detection section 314 compares the H side data change point and the L side data change point every time the DUT 12 outputs the DQ and detects the leading edge time or the trailing edge time of the DQ. Then, the HL phase difference detection section 314 compares the leading edge time or the trailing edge time with a predetermined allowed time to determine that the DUT 12 is passed or failed, and provides information indicative of PASS or FAIL to the OR circuit 316. Additionally, the HL phase difference detection section 364 operates as well as the HL phase difference detection section 314 and determines that the DUT 12 is passed or failed based on the DQS.

The test apparatus 30 according to the present embodiment can detect the phase difference between each of the DQ0–DQn and the DQS which are outputted from the DUT 12, the output timing of the DQ0–DQn and the DQS, the leading edge and the trailing edge in parallel and real time. Therefore, the time required for the test for determining that the DUT 12 is passed or failed can be reduced.

Figure 4:
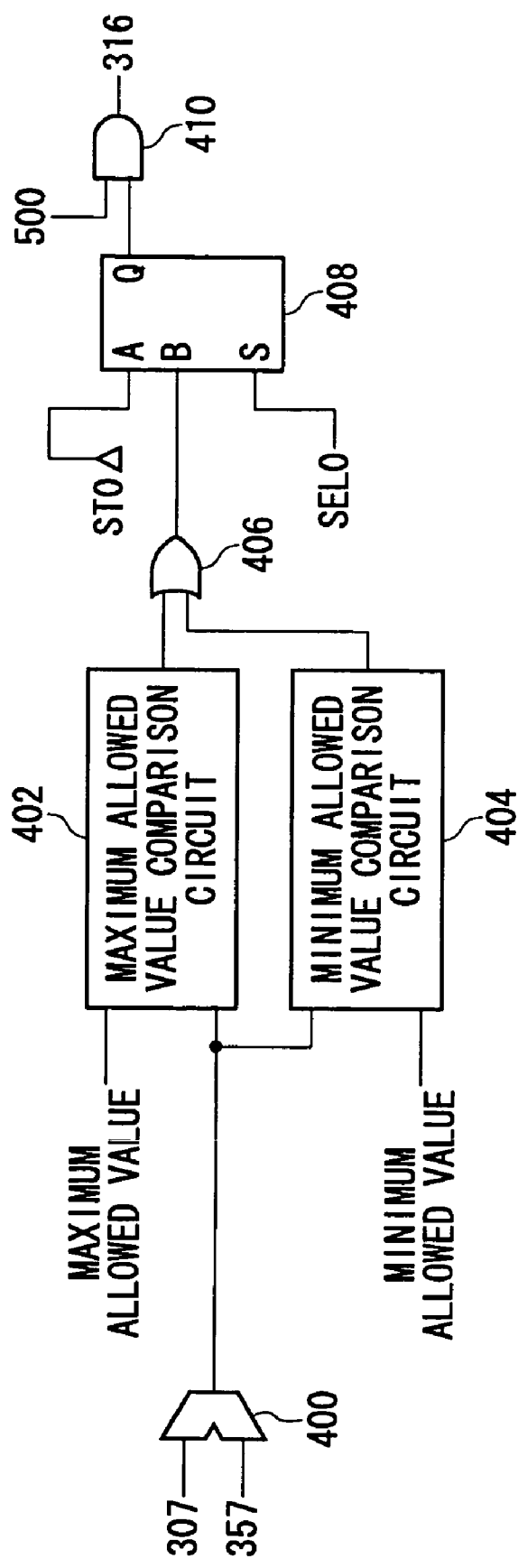
FIG. 4 shows an example of the configuration of a DQS-DQ phase difference detection section 308.

FIG. 4 shows an example of the configuration of a DQS-DQ phase difference detection section 308 according to the second embodiment. The DQS-DQ phase difference detection section 308 includes an arithmetic circuit 400, a maximum allowed value comparison circuit 402, a minimum allowed value comparison circuit 404, an OR circuit 406, a selector 408 and an AND circuit 410. The arithmetic circuit 400 subtracts a data change point which is acquired from the encoder/glitch detection section 307 from a clock change point which is acquired from the encoder/glitch detection section 357 or vice versa, and calculates the phase difference between the DQS and the DQ and outputs the same. The maximum allowed value comparison circuit 402 compares the phase difference outputted by the arithmetic circuit 400 with a predetermined maximum allowed value, outputs the logical value 0 (PASS) when the phase difference is less than the maximum allowed value and outputs the logical value 1 (FAIL) when the phase difference is more than the maximum allowed value. The minimum allowed value comparison circuit 404 compares the phase difference outputted by the arithmetic circuit 400 with a predetermined minimum allowed value, outputs the logical value 0 (PASS) when the phase difference is more than the minimum allowed value and outputs the logical value 1 (FAIL) when the phase difference is less than the minimum allowed value.

Then, the OR circuit 406 performs an OR operation of the logical value outputted by the maximum allowed value comparison circuit 402 and the logical value outputted by the minimum allowed value comparison circuit 404 and outputs the result. That is to say, the OR circuit 406 outputs the logical value 0 (PASS) indicating that the phase difference between the DQS and the DQ of the DUT 12 is normal when the phase difference between the DQS and the DQ is more than the minimum allowed value and less than the maximum allowed time. The selector 408 selects an input A or B based on a select signal (SEL0) and outputs the selected one. The logical value 0 is consistently inputted to the input A. When the test of the phase difference between the DQS and the DQ is performed, the input B is selected and outputted to the AND circuit 410. The AND circuit 410 performs an AND operation of the output of the selector 408 and the output of the AND circuit 500 included in the loose function section 310 and outputs the result to the OR circuit 316. That is to say, the AND circuit 410 outputs the output of the selector 408 only when there is a data change point in the DQ.

Figure 5:
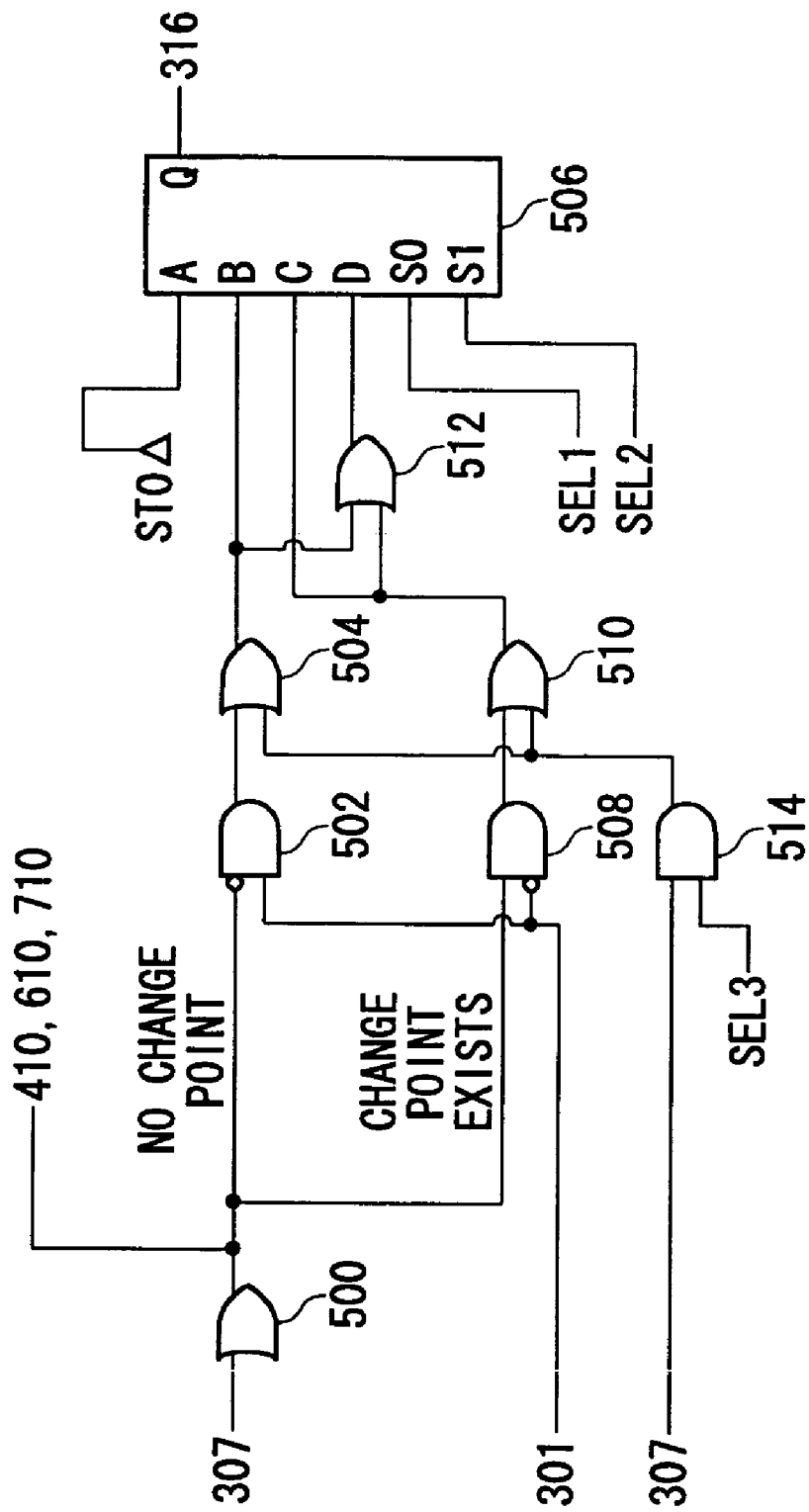
FIG. 5 shows an example of the configuration of a loose function section 310.

FIG. 5 shows an example of the configuration of a loose function section 310 according to the present embodiment. The loose function section 310 includes an OR circuit 500, an AND circuit 502, an OR circuit 504, a selector 506, an AND circuit 508, an OR circuit 510, an OR circuit 512 and an AND circuit 514. The OR circuit 500 outputs the result of the OR operation of data of a plurality of bits indicative of the data change point outputted by the encoder/glitch detection section 307 to the AND circuit 502, the AND circuit 508, the AND circuit 410 included in the DQS-DQ phase difference detection section 308, the AND circuit 610 included in the output timing phase detection section 312 and the AND circuit 710 included in the HL phase difference detection section 314. The AND circuit 502 performs an AND operation of the inverted output of the OR circuit 500 and the output of the timing comparator 301. The AND circuit 508 performs an AND operation of the output of the OR circuit 500 and the inverted output of timing comparator 301. Additionally, the AND circuit 514 performs an AND operation of the glitch detection signal acquired from the encoder/glitch detection section 307 and a select signal (SEL3). That is to say, when the test for determining whether there is any glitch is performed, the signal (logical value 1) as the select signal (SEL3) is provided to the AND circuit 514. Alternatively, when the test except for determining whether there is any glitch is performed, the signal (logical value 0) as the select signal (SEL3) is provided to the AND circuit 514.

The OR circuit 504 performs an OR operation of the output of the AND circuit 502 and the output of the AND circuit 514 and inputs the result to the input B of the selector 506. That is to say, in the case that the output of the H side signal processing section 302 is detected, when it is detected that there is no data change point in the DQ and that the voltage value of the DQ is consistently less than VOH, the logical value 1 (FAIL) is inputted to the input B of the selector 506. Meanwhile, when the other condition such that there is no data change point in the DQ and the voltage value of the DQ is more than VOH is detected, the logical value 0 (PASS) is inputted to the input B of the selector 506. Additionally, in the case that the output of the L side signal processing section 304 is detected, when it is detected that there is no data change point in the DQ and that the voltage value of the DQ is consistently more than VOL, the logical value 1 (FAIL) is inputted to the input B of the selector 506. Meanwhile, when the other condition such that there is no data change point in the DQ and the voltage value of the DQ is less than VOL is detected, the logical value 0 (PASS) is inputted to the input B of the selector 506.

The OR circuit 510 performs an OR operation of the output of the AND circuit 508 and the output of the AND circuit 514 and inputs the result to an input C of the selector 506. That is to say, in the case that the output of the H side signal processing section 302 is detected, when it is detected that there is a data change point in the DQ and that the voltage value of the DQ is changed from the value less than VOH to the value more than VOH, the logical value 0 (PASS) is inputted to the input C of the selector 506. Meanwhile, when it is detected that there is a data change point in the DQ and that the voltage value of the DQ is changed from the value more than VOH to the value less than VOH, the logical value 1 (FAIL) is inputted to the input C of the selector 506. Additionally, in the case that the output of the L side signal processing section 304 is detected, when it is detected that there is a data change point in the DQ and that the voltage value of the DQ is changed from the value more than VOL to the value less than VOL, the logical value 0 (PASS) is inputted to the input C of the selector 506. Meanwhile when it is detected that there is a data change point in the DQ and that the voltage value of the DQ is changed from the value less than VOL to the value more than VOL, the logical value 1 (FAIL) is inputted to the input C of the selector 506.

The OR circuit 512 performs an OR operation of the output of the OR circuit 504 and the output of the OR operation 510 and inputs the result to an input D of the selector 506. The selector 506 outputs a logical value inputted from any one of the input A, B, C and D based on the select signals (SEL1 and SEL2). The input D of the selector 506 is usually selected. Then, the selector 506 outputs the output of the OR circuit 512 to the OR circuit 316. In the case that the logical value 1 (FAIL) is outputted when the output of the level comparison section 102 is the logical value 1 (FAIL), the input B is selected and the output of the OR circuit 504 may be outputted to the OR circuit 316. Additionally, in the case that the logical value 1 (FAIL) is outputted when the output of the level comparison section 102 is the logical value 1 (FAIL) and there is a data change point in the DQ, the input C is selected and the output of the OR circuit 510 may be outputted to the OR circuit 316.

Figure 6:
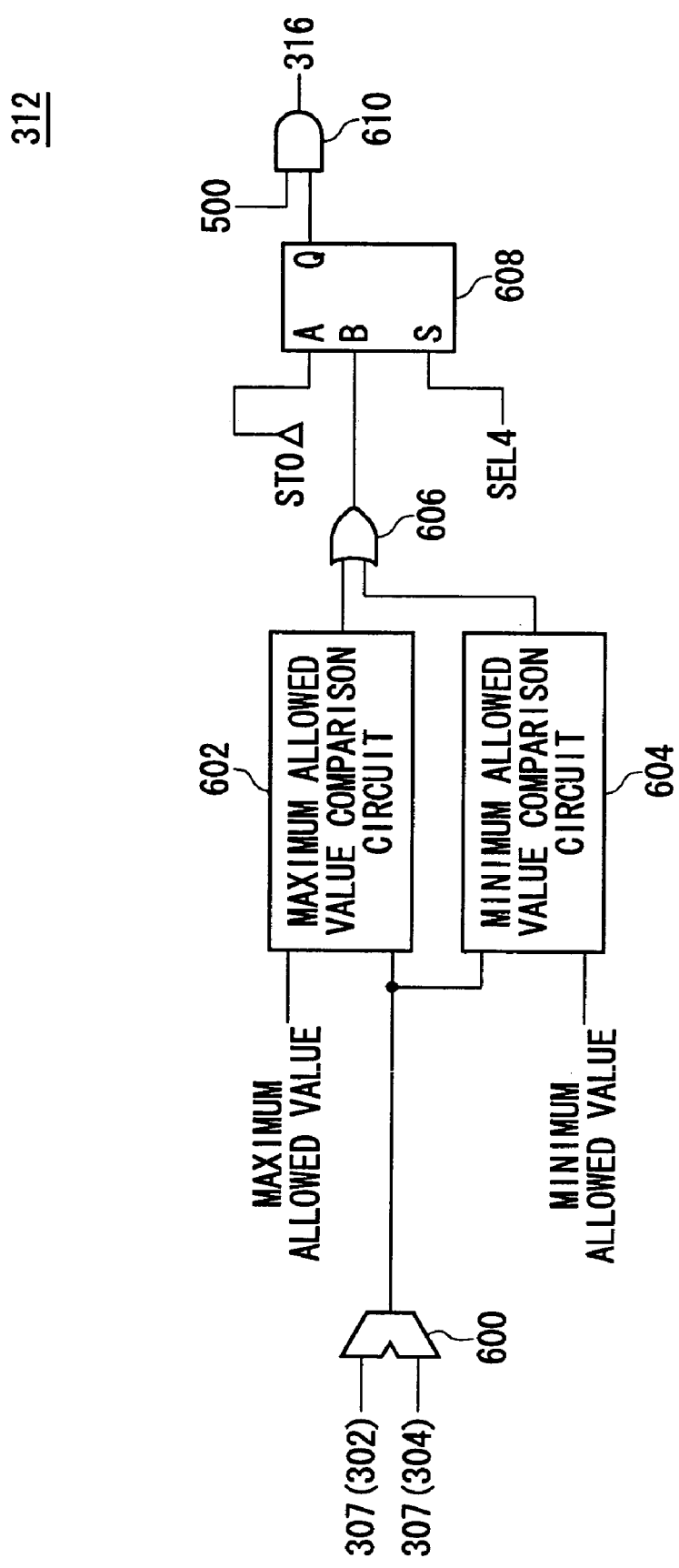
FIG. 6 shows an example of the configuration of an output timing phase detection section 312.

FIG. 6 shows an example of the configuration of an output timing phase detection section 312 according to the present embodiment. The output timing phase detection section 312 includes an arithmetic circuit 600, a maximum allowed value comparison circuit 602, a minimum allowed value comparison circuit 604, an OR circuit 606 and a selector 608. The arithmetic circuit 600 calculates the timing at which it starts to change the DQ based on the H side data change point acquired from the encoder/glitch detection section 307 of the H side signal processing section 302 and the L side clock change point acquired from the encoder/ glitch detection section 357 of the L side signal processing section 304. The maximum allowed value comparison circuit 602 compares the timing at which it starts to change the DQ, which is outputted by the arithmetic circuit 600 with a predetermined maximum allowed value, outputs the logical value 0 (PASS) when the timing at which it starts to change the DQ is less than the maximum allowed value and outputs the logical value 1 (FAIL) when that is more than the maximum allowed value. The minimum allowed value comparison circuit 602 compares the timing at which it starts to change the DQ, which is outputted by the arithmetic circuit 600 with a predetermined minimum allowed value, outputs the logical value 0 (PASS) when the timing at which it starts to change the DQ is more than the minimum allowed value and outputs the logical value 1 (FAIL) when that is less than the minimum allowed value.

The OR circuit 606 performs an OR operation of the logical value outputted by the maximum allowed value comparison circuit 602 and the logical value outputted by the minimum allowed value comparison circuit 604 and outputs the result. That is to say, the OR circuit 606 outputs the logical value 0(PASS) indicating that the timing at which it starts to change in the DUT 12 is normal when the timing at which it starts to change the DQ is more than the minimum allowed value and less than the maximum allowed value. The selector 608 selects an input A or an input B based on a select signal (SEL4) and outputs the selected one. The logical value 0 is consistently inputted to the input A. When a timing at which it starts to change the DQ is tested, the input B is selected and outputted to the AND circuit 610. The AND circuit 610 performs an AND operation of the output of the selector 608 and the output of the OR circuit 500 included in the loose function section 310 and outputs the result to the OR circuit 316. That is to say, the AND circuit 610 outputs the output of the selector 608 to the OR circuit 316 only when there is a change point in the DQ.

Figure 7:
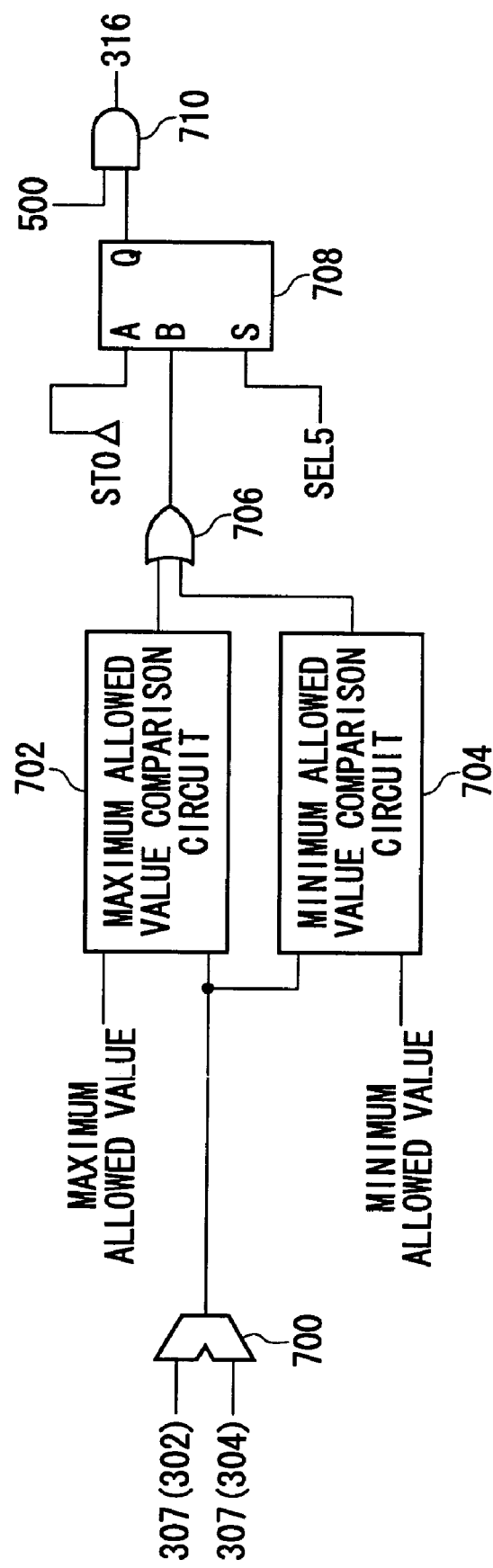
FIG. 7 shows an example of the configuration of an HL phase difference detection section 314.

FIG. 7 shows an example of the configuration of an HL phase difference detection section 314 according to the second embodiment. The HL phase difference detection section 314 includes an arithmetic circuit 700, a maximum allowed value comparison circuit 702, a minimum allowed value comparison circuit 704, an OR circuit 706 and a selector 708. The arithmetic circuit 700 subtracts a H side data change point which is acquired from the encoder/glitch detection section 307 of the H side signal processing section 302 from a L side clock change point which is acquired from the encoder/glitch detection section 357 of the L side signal processing section 304 or vice versa, and outputs the leading edge time or the trailing edge time of the DQ. The maximum allowed value comparison circuit 702 compares the leading edge time or the trailing edge time outputted by the arithmetic circuit 700 with a predetermined maximum allowed value, outputs the logical value 0 (PASS) when the leading edge time or the trailing edge time is less than the maximum allowed value and outputs the logical value 1 (FAIL) when that is more than the maximum allowed value. The minimum allowed value comparison circuit 704 compares the leading edge time or the trailing edge time outputted by the arithmetic circuit 700 with a predetermined minimum allowed value, outputs the logical value 0 (PASS) when the leading edge time or the trailing edge time is more than the minimum allowed value and outputs the logical value 1 (FAIL) when that is less than the minimum allowed value.

Then, the OR circuit 706 performs an OR operation of the logical value outputted by the maximum allowed value comparison circuit 702 and the logical value outputted by the minimum allowed value comparison circuit 704 and outputs the result. That is to say, the OR circuit 706 outputs the logical value 0 (PASS) indicating that the leading edge time or the trailing edge time of the DUT 12 is normal when the leading edge time or the trailing edge time of the DQ is more than the minimum allowed value and less than the maximum allowed time. The selector 708 selects an input A or B based on a select signal (SEL5) and outputs the selected one. The logical value 0 is consistently inputted to the input A. When the test of the leading edge time or the trailing edge time of the DQ is performed, the input B is selected and outputted to the AND circuit 710. The AND circuit 710 performs an AND operation of the output of the selector 708 and the output of the OR circuit 500 included in the loose function section 310 and outputs the result to the OR circuit 316. That is to say, the AND circuit 710 outputs the output of the selector 708 to the OR circuit 316 only when there is a data change point in the DQ.

Figure 8:
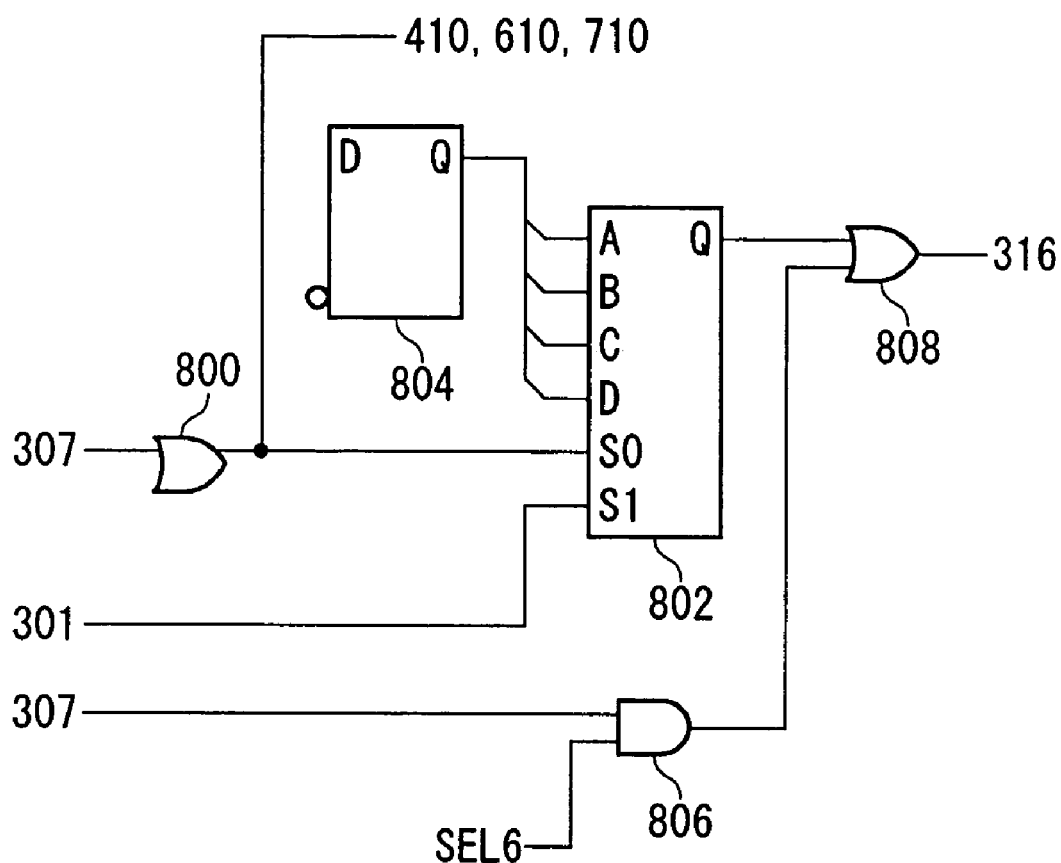
FIG. 8 shows another example of the configuration of the loose function section 310.

FIG. 8 shows another example of the configuration of the loose function section 310 according to the second embodiment. The loose function section 310 includes an OR circuit 800, a selector 802, a register 804, an AND circuit 806 and an OR circuit 808. The OR circuit 800 outputs the result of the OR operation of data of a plurality of bits indicative of the data change point outputted by the encoder/glitch detection section 307 to the selector 802, the AND circuit 410 included in the DQS-DQ phase difference detection section 308, the AND circuit 610 included in the output timing phase detection section 312 and the AND circuit 710 included in the HL phase difference detection section 314.

The register 804 previously stores register values to be inputted to each of the input A, B, C and D of the selector 802. The selector 802 acquires the output of the OR circuit 800 as a select signal from an input S0, and acquires the output of the timing comparator 301 as a select signal from an input S1. Additionally, the selector 802 acquires the register values stored in the register 804 from the input A, B, C and D. Then, the selector 802 outputs the logical value inputted from any one of the input A, B, C and D based on the combination of the output of the OR circuit 800 which indicates whether there is a data change point in the DQ and the output of the timing comparator 301 which is a start determination signal. That is to say, the register value stored in the register 804 is changed, so that the status of the DQ can be detected as well as the loose function section 310 shown in FIG. 5.

Specifically, the selector 802 selects the input A and outputs the same when the output of the OR circuit 800 is the logical value 0 and the output of the timing comparator 301 is the logical value 0. Additionally, the selector 802 selects the input B and outputs the same when the output of the OR circuit 800 is the logical value 1 and the output of the timing comparator 301 is the logical value 1. Additionally, the selector 802 selects the input C and outputs the same when the output of the OR circuit 800 is the logical value 1 and the output of the timing comparator 301 is the logical value 0. Further, the selector 802 selects the input D and outputs the same when the output of the OR circuit 800 is the logical value 1 and the output of the timing comparator 301 is the logical value 1. Then, when the register 804 stores the logical value 0, 0, 0 and 0 as the register values to be inputted to each of the input A, B, C and D of the selector 802, the selector 802 outputs the logical value same as the input A of the selector 506 shown in FIG. 5. Additionally, when the register 804 stores the logical value 0, 0, 1 and 0 as the register values to be inputted to each of the input A, B, C and D of the selector 802, the selector 802 outputs the logical value same as the input B of the selector 506 shown in FIG. 5. Additionally, when the register 804 stores the logical value 0, 1, 0 and 0 as the register values to be inputted to each of the input A, B, C and D of the selector 802, the selector 802 outputs the logical value same as the input C of the selector 506 shown in FIG. 5. Further, when the register 804 stores the logical value 0, 1, 1 and 0 as the register values to be inputted to each of the input A, B, C and D of the selector 802, the selector 802 outputs the logical value same as the input D of the selector 506 shown in FIG. 5.

The AND circuit 806 performs an AND operation of the glitch detection signal acquired from the encoder/glitch detection section 307 and a select signal (SEL6). Then, the OR circuit 808 performs an OR operation of the output of the selector 802 and the output of the AND circuit 806 and outputs the result to the OR circuit 316. That is to say, when a test for determining whether there is any glitch is performed, the signal (logical value 1) as the select signal (SEL6) is provided to the AND circuit 806. Alternatively, when the test except for determining whether there is any glitch is performed, the signal (logical value 0) as the select signal (SEL6) is provided to the AND circuit 806.

The test apparatus 30 according to the present embodiment, the DQS-DQ phase difference detection section 308, the loose function section 310, the output timing phase detection section 312 and the HL phase difference detection section 314 are configured based on the hardware logic as shown in FIG. 4, FIG. 5, FIG. 6, FIG. 7 and FIG. 8. Therefore, the phase difference between the DQ and the DQS, the output timing of the DQ and the DQS, the leading edge time, the trailing edge time and the glitch can be detected at high speed. Thereby the test apparatus 30 can test the DUT 12 in real time and in parallel with outputting by the DUT 12. Further, the time required for testing for determining that the DUT 12 is passed or failed can be reduced.

While the present invention have been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

According to the present invention as thus described above, a test apparatus for accurately testing in real time a device under test for synchronizing a data signal with a clock signal and outputting the same can be provided.

What is claimed is:

1. A test apparatus for testing a device under test for synchronizing a data signal with a clock signal and outputting the same, comprising:
   a data sampler for sequentially sampling the data signals outputted from the device under test to acquire a plurality of data sample values;
   a data change point detection section for detecting a data change point at which the data signal is changed based on the plurality of data sample values acquired by the data sampler;
   a data change point storage section for writing the data change point detected by the data change point detection section based on a first clock signal and reading the same based on a second clock signal of which period is approximately same as the first clock signal and of which phase is different from the first clock signal;
   a clock sampler for sequentially sampling the clock signals outputted from the device under test to acquire a plurality of clock sample values;

a clock change point detection section for detecting a clock change point at which the clock signal is changed based on the plurality of clock sample values acquired by the clock sampler; and a clock change point storage section for writing the clock change point detected by the clock change point detection section based on a third clock signal and reading the same based on the second clock signal;

a phase difference detection section for comparing the data change point and the clock change point which are simultaneously read from the data change point storage section and the clock change point storage section based on the second clock signal and detecting the phase difference between the data signal and the clock signal; and a spec comparison section for comparing the phase difference detected by the phase difference detection section with a predetermined spec to determine that the device under test is passed or failed.

2. The test apparatus according to claim 1, wherein the phase difference between the first clock signal and the second clock signal is more than the difference between a transmission delay time from the data change point detection section to the data change point storage section and a transmission delay time from the clock change point detection section to the clock change point storage section.

3. The test apparatus according to claim 1 further comprising:

a data processing unit in which the data sampler, the data change point detection section, the data change point storage section, the clock change point storage section, the phase difference detection section and the spec comparison section are formed;

a clock signal processing unit in which the clock sampler and the clock change point detection section are formed;

a transmission path through which the data signal processing unit and the clock signal processing unit are electrically connected, for providing the clock change point detected by the clock change point detection section to the clock change point storage section, wherein the phase difference between the first clock signal and the second clock signal is more than the transmission delay time in the transmission path.

4. The test apparatus according to claim 3 including a plurality of data signal processing units, wherein the transmission path electrically connects the clock signal processing unit and the plurality of data signal processing units and provides the clock change point detected by the clock change point detection section included in the clock signal processing unit to the plurality of clock change point storage sections for each of the plurality of data signal processing units, and the plurality of clock change point storage section write the clock change point detected by the clock change point detection section based on a third clock signal and read the same based on a second clock signal.

5. A test apparatus for testing a device under test for synchronizing a data signal and a clock signal and outputting the same, comprising:

a data change point detection section for detecting a data change point at which the data signal outputted from the device under test is changed;

a clock change point detection section for detecting a clock change point at which the clock signal outputted from the device under test is changed; and a phase difference detection section for comparing the data change point with the clock change point every time the device under test outputs a data signal and a clock signal to detect the phase difference between the data signal and the clock signal, and for comparing the phase difference with a predetermined allowed value to determine that the device under test is passed or failed, wherein the phase difference detection section including:

an arithmetic circuit for subtracting the data change point from the clock change point, or subtracting the clock change point from the data change point and outputting the phase difference;

a maximum allowed value comparison circuit for comparing the phase difference outputted by the arithmetic circuit with a predetermined maximum allowed value, outputting the logical value 0 when the phase difference is less than the maximum allowed value and outputting the logical value 1 when the phase difference is more than the maximum allowed value;

a minimum allowed value comparison circuit for comparing the phase difference outputted by the arithmetic circuit with a predetermined minimum allowed value, outputting the logical value 0 when the phase difference is more than the minimum allowed value and outputting the logical value 1 when the phase difference is less than the minimum allowed value; and an OR circuit for performing an OR operation of the logical value outputted by the maximum allowed value comparison circuit and the logical value outputted by the minimum allowed value comparison circuit.

6. A test device for testing a device under test, comprising:

a change point detection section for detecting a data change point at which a data signal outputted from the device under test is changed and outputting data of a plurality of bits indicative of the data change point;

a start determination signal output section for outputting a start determination signal to output the logical value 0 when the data signal is more than a H side threshold value at the time at which it starts to output the data signal outputted from the device under test and output the logical value 1 when the data signal is less than the H side threshold value; and a loose function section having a first OR circuit for performing an OR operation of the data of the plurality of bits outputted by the change point detection section and an AND circuit for performing an AND operation of the inverted output of the OR circuit and the output of the start determination signal output section, for detecting that there is no data change point in the data signal and that the data signal is less than the H side threshold value and outputting the same.

7. A test apparatus for testing a device under test, comprising:

a change point detection section for detecting a data change point at which a data signal outputted from the device under test is changed and outputting data of a plurality of bits indicative of the data change point;

a start determination signal output section for outputting a start determination signal to output the logical value 0 when the data signal is less than a L side threshold value at the time at which it starts to output the data signal outputted from the device under test and output the logical value 1 when the data signal is more than the L side threshold value; and a loose function section having a first OR circuit for performing an OR operation of the data of the plurality of bits outputted by the change point detection section and an AND circuit for performing an AND operation of the inverted output of the OR circuit and the output of the start determination signal output section, for detecting that there is no data change point in the data signal and that the data signal is more than the L side threshold value and outputting the same.

8. The test apparatus according to claim 6, further comprising a glitch detection section for detecting whether any glitch is generated in the data signal, outputting the logical value 1 when a glitch is detected and outputting the logical value 0 when any glitch is not detected, wherein
the loose function section further includes a second OR circuit for performing an OR operation of the output of the AND circuit and the output of the glitch detection section and further detects that a glitch is generated in the data signal.

9. The test apparatus according to claim 7, further comprising a glitch detection section for detecting whether any glitch is generated in the data signal, outputting the logical value 1 when a glitch is detected and outputting the logical value 0 when any glitch is not detected, wherein
the loose function section further includes a second OR circuit for performing an OR operation of the output of the AND circuit and the output of the glitch detection section and further detects that a glitch is generated in the data signal.

10. A test apparatus for testing a device under test, comprising:
a change point detection section for detecting a data change point at which the data signal outputted from the device under test is changed and outputting data of a plurality of bits indicative of the detected data change point;
a start determination signal output section for outputting a start determination signal to output the logical value 0 when the data signal is more than a H side threshold value at a time at which it starts to output the data signal outputted from the device under test and output the logical value 1 when the data signal is less than the H side threshold value; and
a loose function section having a first OR circuit for performing an OR operation of data of a plurality of bits outputted by the change point detection section and an AND circuit for performing an AND operation of the output of the OR circuit and the inverted output of the start determination signal output section, for detecting that there is a data change point in the data signal and that the data signal is changed from a value less than the H side threshold value to a value more than the H side threshold value and outputting the same.

11. A test apparatus for testing a device under test, comprising:
a change point detection section for detecting a data change point at which the data signal outputted from the device under test is changed and outputting data of a plurality of bits indicative of the detected data change point;
a start determination signal output section for outputting a start determination signal to output the logical value 0 when the data signal is less than a L side threshold value at a time at which it starts to output the data signal outputted from the device under test and output the logical value 1 when the data signal is more than the L side threshold value; and
a loose function section having a first OR circuit for performing an OR operation of data of a plurality of bits outputted by the change point detection section and an AND circuit for performing an AND operation of the output of the OR circuit and the inverted output of the start determination signal output section, for detecting that there is a data change point in the data signal and that the data signal is changed from a value more than the L side threshold value to a value less than the L side threshold value and outputting the same.

12. The test apparatus according to claim 10, further comprising a glitch detection section for detecting that a glitch is generated in the data signal based on data of the plurality of bits outputted by the change point detection section, outputting the logical value 1 when a glitch is detected and outputting the logical value 0 when any glitch is not detected, wherein
the loose function section further includes a second OR circuit for performing an OR operation of the output of the AND circuit and the output of the glitch detection section and further detects that a glitch is generated in the data signal.

13. The test apparatus according to claim 11, further comprising a glitch detection section for detecting that a glitch is generated in the data signal based on data of the plurality of bits outputted by the change point detection section, outputting the logical value 1 when a glitch is detected and outputting the logical value 0 when any glitch is not detected, wherein
the loose function section further includes a second OR circuit for performing an OR operation of the output of the AND circuit and the output of the glitch detection section and further detects that a glitch is generated in the data signal.

14. A test apparatus for testing a device under test, comprising:
an H side level comparison section for sequentially determining whether data signals outputted from the device under test are more than a H side threshold value and outputting the same;
an H side data change point detection section for detecting an H side data change point at which the data signal outputted by the H side level comparison section is changed;
an L side level comparison section for sequentially determining whether data signals outputted from the device under test is less than a L side threshold value and outputting the same;
an L side data change point detection section for detecting an L side data change point at which the data signal outputted by the L side level comparison section is changed; and
an output timing phase detection section for detecting a timing at which it starts to change the data signal, which is the middle point between the H side data change point and the L side data change point every time the device under test outputs the data signal, and for comparing the timing at which it starts to change the data signal with a predetermined allowed value to determine that the device under test is passed or failed, wherein the output timing phase detection section including:
an arithmetic circuit for calculating the timing at which it starts to change the data signal based on the H side data change point and the L side data change point;
a maximum allowed value comparison circuit for comparing the timing at which it starts to change the data signal, which is outputted by the arithmetic circuit with a predetermined maximum allowed value, outputting the logical value 0 when the timing at which it starts to change the data signal is less than the maximum allowed value and outputting the logical value 1 when that is more than the maximum allowed value;

a minimum allowed value comparison circuit for comparing the timing at which it starts to change the data signal, which is outputted by the arithmetic circuit with a predetermined minimum allowed value, outputting the logical value 0 when the timing at which it starts to change the data signal is more than the minimum allowed value and outputting the logical value 1 when that is less than the minimum allowed value; and an OR circuit for performing an OR operation of the logical value outputted by the maximum allowed value comparison circuit and the logical value outputted by the minimum allowed value comparison circuit.

15. A test apparatus for testing a device under test, comprising:

an H side level comparison section for sequentially determining whether data signals outputted from the device under test are more than a H side threshold value and outputting the same;

an H side data change point detection section for detecting an H side data change point at which the data signal outputted by the H side level comparison section is changed;

an L side level comparison section for sequentially determining whether data signals outputted from the device under test is less than a L side threshold value and outputting the same;

an L side data change point detection section for detecting an L side data change point at which the data signal outputted by the L side level comparison section is changed; and a phase difference detection section for comparing the H side data change point with the L side data change point every time the device under test outputs the data signal to detect the leading edge time or the trailing edge time of the data signal, and comparing the leading edge time or the trailing edge time with a predetermined allowed value to determine that the device under test is passed or failed, wherein the phase difference detection section including:

an arithmetic circuit for subtracting the H side data change point from the L side data change point or subtracting the L side data change point from the H side data change point, and outputting the leading edge time or the trailing edge time;

a maximum allowed value comparison circuit for comparing the leading edge time or the trailing edge time outputted by the arithmetic circuit with a predetermined maximum all owed value, outputting the logical value 0 when the leading edge time or the trailing edge time is less than the maximum allowed value and outputting the logical value 1 when that is more than the maximum allowed value;

a minimum allowed value comparison circuit for comparing the leading edge time or the trailing edge time outputted by the arithmetic circuit with a predetermined minimum allowed value, outputting the logical value 0 when the leading edge time or the trailing edge time is more than the minimum allowed value and outputting the logical value 1 when that is less than the minimum allowed value; and an OR circuit for performing an OR operation of the logical value outputted by the maximum allowed value comparison circuit and the logical value outputted by the minimum allowed value comparison circuit.

* * * * *